United States Patent
Saedi et al.

(10) Patent No.: US 10,416,212 B2
(45) Date of Patent: Sep. 17, 2019

(54) DIS-ENGAGING TEST POINT

(71) Applicant: ARRIS Enterprises LLC, Suwanee, GA (US)

(72) Inventors: Reza A. Saedi, Bryn Mawr, PA (US); David Francis Lewandowski, West Chester, PA (US); Vipul Rathod, North Wales, PA (US)

(73) Assignee: ARRIS Enterprises LLC, Suwanee, GA (US)

( * ) Notice: Subject to any disclaimer, the term of this patent is extended or adjusted under 35 U.S.C. 154(b) by 75 days.

(21) Appl. No.: 15/852,195

(22) Filed: Dec. 22, 2017

(65) Prior Publication Data

US 2019/0195927 A1 Jun. 27, 2019

(51) Int. Cl.
*G01R 19/25* (2006.01)
*G01R 27/32* (2006.01)

(52) U.S. Cl.
CPC .................... *G01R 27/32* (2013.01)

(58) Field of Classification Search
CPC ............ H04L 12/2801; H04L 12/2856; H04L 12/287; H04L 27/3416; H04L 27/362; H04L 5/08; H04L 41/0823; H04L 43/50; H04L 1/24; H04L 2001/0093; H04L 27/2626; H04L 43/0811; H04L 43/0847; H04L 43/0852; H04L 43/0864; H04L 43/0882; H04M 3/08; H04B 1/406; H04B 10/0793; H04B 10/27; H04B 17/29; H04B 17/3912; H04N 21/6118; H04N 21/6168; H04N 7/173; H04N 7/17309; H04N 21/226; H04N 7/104; H04N 17/00; H04N 21/61; G06F 17/5004; H04H 20/78; H04W 24/00; H04W 72/0453; H01P 5/12; H04Q 11/0005; H04Q 11/0062; H04Q 2011/0083
See application file for complete search history.

(56) References Cited

U.S. PATENT DOCUMENTS

| | | | |
|---|---|---|---|
| 6,255,581 B1 | 7/2001 | Reis et al. | |
| 6,906,526 B2* | 6/2005 | Hart, Jr. .............. | H04L 12/2801 324/527 |
| 7,129,421 B2 | 10/2006 | Reis et al. | |
| 7,415,367 B2* | 8/2008 | Williams .............. | H04N 17/00 348/192 |
| 2009/0320085 A1* | 12/2009 | Wang .................. | H04L 12/2801 725/125 |

* cited by examiner

*Primary Examiner* — Vinh P Nguyen
(74) *Attorney, Agent, or Firm* — Lori Anne D. Swanson

(57) ABSTRACT

A test point circuit includes a main RF signal path (e.g., transmission line, lumped-element network, etc.), a test point RF signal circuit, a test point structure having a center conductor and corresponding grounded sleeve and being configured for connecting to a test probe for monitoring the RF signal carried through the main RF signal path, and a switch between the main RF signal path and the test point RF signal circuit. In the open position of the switch, the signal in the main RF signal path is prevented from propagating to the center conductor of the test point structure. In the closed position of the switch, the RF signal can propagate from the main RF signal path to the center conductor of the test point structure. The test probe mated to the test point structure can then measure or monitor the RF signal carried through the main RF signal path.

21 Claims, 6 Drawing Sheets

DIS-ENGAGING TEST POINT

TECHNICAL FIELD

The present subject matter relates to electronic Radio Frequency (RF) signal path test point circuitry for cable television equipment that is capable of being disengaged from the RF signal path when not in use.

BACKGROUND

Broadband and hybrid fiber coax (HFC) equipment commonly employ RF test points for monitoring signals propagated through an RF signal path. RF test points are typically connected to a directional coupler that is connected to the main RF signal path. The main RF signal path may be a transmission line, lumped-element network, etc. A directional coupler is normally used to (i) direct most of the signal power to the main RF signal path, and (ii) direct a limited amount of the signal power to the RF test point (or any another circuit). A user can monitor the limited power version of the RF output signal by connecting measuring equipment via a probe to the test point.

The signal power directed to the main RF signal path incurs an undesired amount of loss as a result of the directional coupler. This undesirable loss associated with the directional coupler is incurred at all times during operation of the equipment despite the fact that the RF test point may be used infrequently (e.g., annually). It would be desirable to minimize the amount of loss incurred in the main RF signal path while providing a user the capability to monitor the main RF signal path using the RF test point.

SUMMARY

An example of a test point circuit includes a main RF signal path for carrying an RF signal, an electronic or electro-mechanical or mechanical switch coupled to the main RF signal path and coupled to a test point circuit, a test point circuit, and a test point structure having a center conductor and corresponding grounded sleeve and being configured for connecting to a test probe for monitoring the RF signal carried through main RF signal path. In the open position of the switch, the RF signal from the main RF signal path is prevented from being carried to the center conductor of the test point structure, and, in a closed position of the switch, the RF signal from the main RF signal path propagates to the test point center conductor such that the test probe mated to the test point structure can monitor the signal carried through the main RF signal path.

Another example of a dis-engaging test point circuit includes a main RF signal path, a main RF signal path for carrying an RF signal, and a test point structure having a center conductor and corresponding grounded sleeve which is configured for connecting to a test probe for monitoring the RF signal carried through the main RF signal path, a switch coupled to the main RF signal path and coupled to a test point circuit, and a test point structure. In an open position of the switch, the RF signal is prevented from being carried from the main RF signal path to the test point center conductor, and, in a closed position of the switch, the RF signal propagates from the main RF signal path to the test point center conductor such that the test probe connected to the test point center conductor can monitor the RF signal carried through the main RF signal path. Means for detecting the presence of the test probe are mounted to the test point structure. The detecting means transmits a control signal to the switch, and wherein the control signal is configured to close the switch when the detecting means detects the presence of the test probe being mated to the test point structure.

Another example of a dis-engaging test point circuit provides a method of monitoring an RF signal carried through a main RF signal path using a test point structure that is connected to the main RF signal path through a switch and test point circuit. The method includes detecting the presence of a test probe mated to the test point structure; and upon detection, controlling the state of a switch in a test point circuit from an open state to a closed state, which connects the main RF signal path to the center conductor of the test point structure, thereby directing the RF signal from the main RF signal path through the test point circuit and to the test point center conductor.

Additional objects, advantages and novel features of the examples will be set forth in part in the description which follows, and in part will become apparent to those skilled in the art upon examination of the following and the accompanying drawings or may be learned by production or operation of the examples. The objects and advantages of the present subject matter may be realized and attained by means of the methodologies, instrumentalities and combinations particularly pointed out in the appended claims.

BRIEF DESCRIPTION OF THE DRAWINGS

The drawing figures depict one or more implementations in accord with the present concepts, by way of example only, not by way of limitations. In the figures, like reference numerals refer to the same or similar elements.

It should be understood that the features in FIGS. 3-10 are shown schematically, and features which would be ordinarily obscured by other features are still shown.

DETAILED DESCRIPTION

In the following detailed description, numerous specific details are set forth by way of examples in order to provide a thorough understanding of the relevant teachings. However, it should be apparent that the present teachings may be practiced without such details. In other instances, well known methods, procedures, components, and/or circuitry have been described at a relatively high-level, without detail, in order to avoid unnecessarily obscuring aspects of the present teachings.

Figure 1:
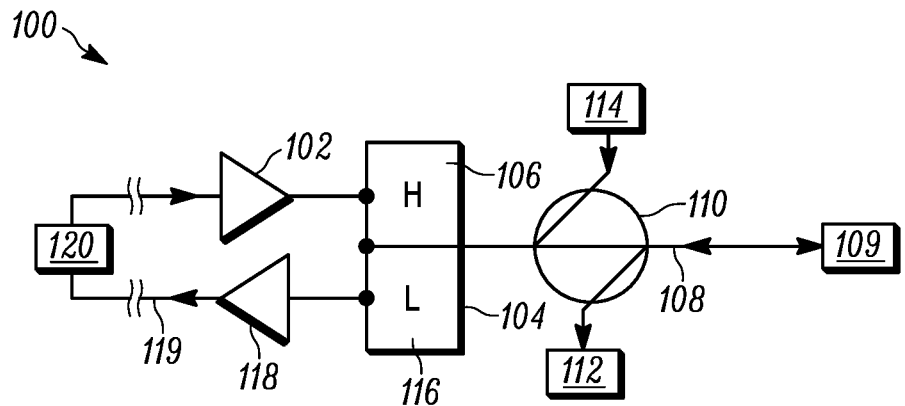
FIG. 1 is a schematic view depicting a circuit incorporating a directional coupler and RF test points.

FIG. 1 depicts a conventional circuit 100 incorporating a directional coupler and two RF test points. More particularly, the conventional circuit 100 generally includes a power amplifier 102 that amplifies a 52 MHz to 1000 MHz forward path signal into a highband "H" port 106 of a diplex filter 104. The diplex filter 104 outputs the forward path signal into a main RF signal path 108.

Forward and return path signals are transmitted through the main RF signal path 108. The forward path signals are propagated in a downstream direction (e.g., from device 120 to device 109), whereas the return path signals are propagated in an upstream direction (e.g., from device 109 to device 120).

The 5 MHz to 42 MHz return path signals travel from the main RF signal path 108 into the diplex filter 104. The diplex filter 104 is configured to output the return path signals through the lowband "L" port 116. A power amplifier 118 amplifies the return path signals output through the lowband "L" port 116 and into a line 119 connected to upstream device 120.

A directional coupler 110 is coupled to the main RF signal path 108. A forward path test point 112 is coupled to one port of the directional coupler 110, and a return path test point 114 is coupled to another port of the directional coupler 110. A user can monitor the forward path signal transmitted through the main RF signal path 108 using the forward path test point 112. A user can also inject a signal or tone through the return path test point 114, which is transmitted in an upstream direction into the diplex filter 104 and the line 119 toward the upstream device 120. The signal or tone is monitored at a location upstream of the diplex filter 104.

As discussed in the Background section, the signal power directed through the forward path of the main RF signal path 108 incurs an undesired amount of loss, e.g., on the order of 1 dB, as a result of the splitting effect of the directional coupler 110. This undesirable loss is incurred at all times during operation of the equipment due to the circuitry of the directional coupler even though the forward path test point 112 may be used infrequently. In various applications a constant 1 dB loss is highly undesirable.

Figure 2:
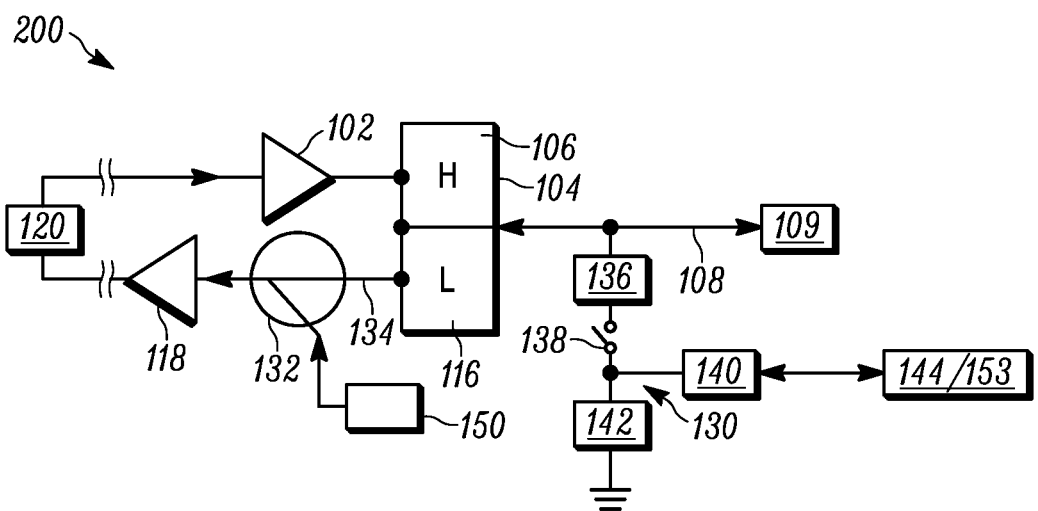
FIG. 2 is a schematic view depicting a circuit incorporating a dis-engaging test point circuit.

FIG. 2 depicts a circuit 200 incorporating a standard directional coupler test point 150, and a dis-engaging test point 144. In contrast to the circuit 100 comprising the directional coupler 110, the circuit 200 of FIG. 2 is configured to minimize the amount of loss incurred in the forward path of the main RF signal path 108 while providing a user the capability to monitor the forward and return path signals propagated through the main RF signal path using RF test points.

The primary differences between the circuits 100 and 200 are that the directional coupler 110 is replaced by a test point circuit 130, and a directional coupler 132 is added to the return path line 134 upstream of the diplex filter 104.

The test point circuit 130 is coupled to the main RF signal path 108 at a location downstream of the diplex filter 104 (as viewed in the forward path direction). The test point circuit 130 includes electrical lines, three impedance blocks 136, 140 and 142 in a T or Y configuration coupled to the electrical lines, and a switch 138 coupled at the intersection of the impedance blocks 136, 140 and 142. The first impedance block 136 is coupled to the main RF signal path 108.

The second impedance block 140 is coupled to a forward path test point 144. The third impedance block 142 is coupled to ground. The impedance blocks 136, 140 and 142 may be resistors, for example.

In the open position (shown) of the switch 138, the forward path signal in line 108 is prevented from reaching the test point 144. In the closed position of the switch 138, the forward path signal in line 108 propagates through the closed switch 138 to the test point 144. A user can monitor the forward path signal propagated through the main RF signal path 108 by inserting a test probe into the test point 144. The switch 138 is only closed when a user desires to monitor the forward path signal propagated through the main RF signal path 108 using the test point 144. When the test point 144 is not in use, the switch 138 remains open, thereby averting a constant 1 dB loss (approximate) (as compared with the directional coupler 110 of the circuit 100).

Thus, the switch 138 is maintained in the open position in normal operation; and, the switch 138 is only moved to the closed position when a user desires to monitor the forward path signal propagated through the main RF signal path 108. It is noted that the loss incurred by the circuit 130 may only be 0.1 dB, for example, which is significantly less than the 1 dB loss incurred by the directional coupler 110 of the circuit 100. The circuitry that controls the switch 138 is not shown in FIG. 2, however, it will be described with reference to FIG. 3 (according to one example) and FIG. 7 (according to another example).

The directional coupler 132 is coupled to the return path line 134 at a location downstream of the diplex filter 104 (as viewed in the return path direction, see arrow on line 134). A return path test point 150 is coupled to the directional coupler 132. A user can inject a signal or tone through the return path test point 150 through the main RF signal path 134 toward the upstream device 120. The signal or tone is monitored at a location downstream of the directional coupler 132 (as viewed in the return path direction).

It should be understood that the downstream device 109, upstream device 120, the diplex filter 104, the power amplifiers 102 and 118, and the directional coupler 132 are optional components of the circuit 200.

Figure 3:
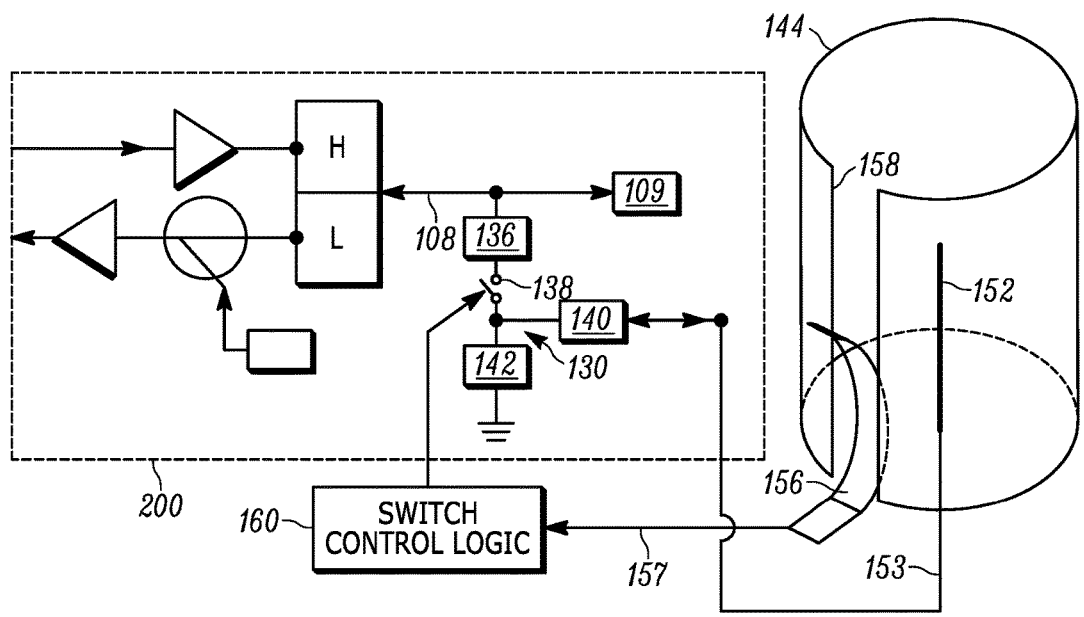
FIG. 3 is a schematic view depicting the circuit of FIG. 2 connected to an RF test point structure, according to one exemplary embodiment.
Figure 4:
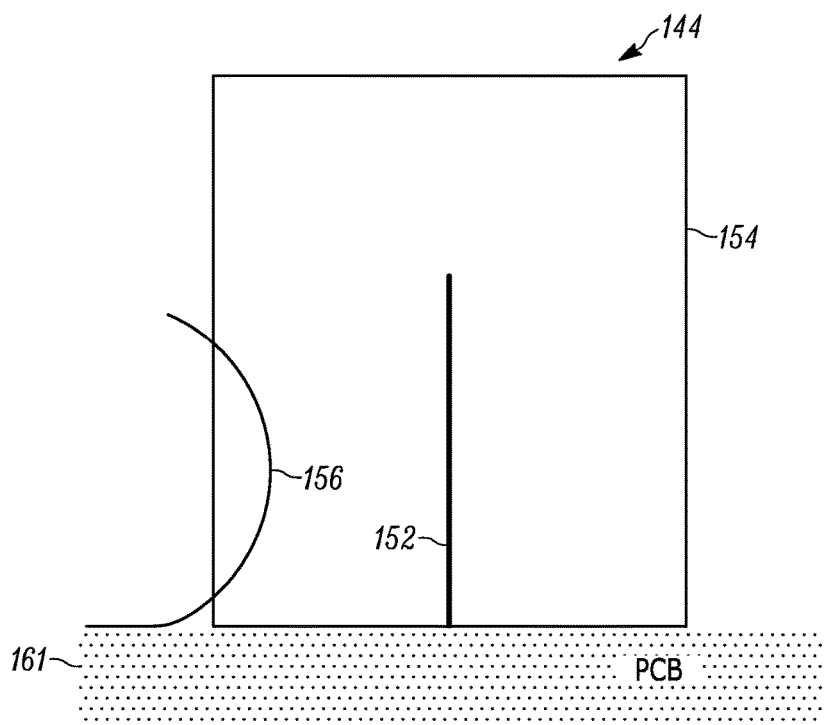
FIG. 4 is a schematic view depicting a cross-sectional view of the RF test point structure of FIG. 3.

FIG. 3 schematically depicts the interconnection between the test point 144 and the test point circuit 130 of the circuit 200 of FIG. 2, according to one example. FIG. 4 depicts a cross-sectional view of the test point 144 of FIG. 3, which is shown schematically.

The test point 144 comprises a center conductor 152, an annular sleeve 154 surrounding the center conductor 152, and a conductive and resilient curved spring 156 that is positioned within a slot 158 defined in the sleeve 154. The center conductor 152 is electrically coupled to the second impedance block 140 of the circuit 130 by the line 153. The bottom end of the spring 156 is electrically coupled to switch control logic 160 by line 157. The line 157 may be a ground trace. The switch control logic 160, which may be considered as a relay switch circuit, is coupled to and controls the switch 138. The switch control logic 160 may also be referred to herein as a linkage. The linkage may be electrical, electromechanical, or a mechanical circuit, for example. The spring 156 is at least partially positioned within the interior of the annular sleeve 154. The center conductor 152 and the spring 156 of the test point 144 are each configured to interact with a standard RF test probe 180, as will be described hereinafter.

The circuit 200, or portions thereof, is bodily incorporated onto the printed circuit board 161, and the circuit 200 is electrically coupled to both the conductor 152 and the spring 156, as is shown in FIG. 3. The center conductor 152 and the spring 156 are mounted to separate traces on the board 161. The center conductor 152 and the spring 156 are configured to interact with a standard RF test probe 180, as will be described hereinafter.

Figure 5:
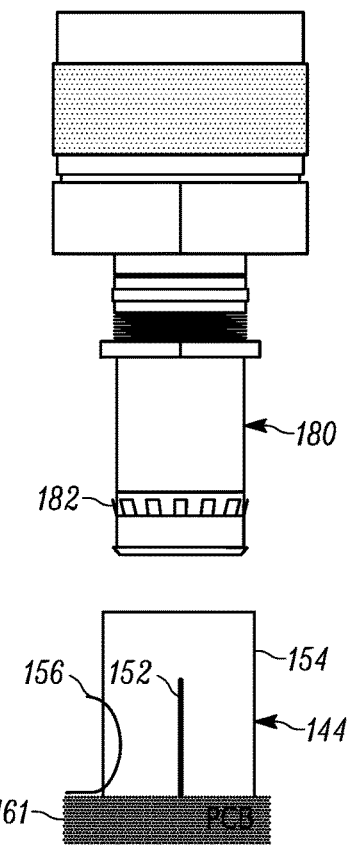
FIG. 5 is a schematic view depicting a test probe prior to mating with the RF test point of FIG. 3.
Figure 6:
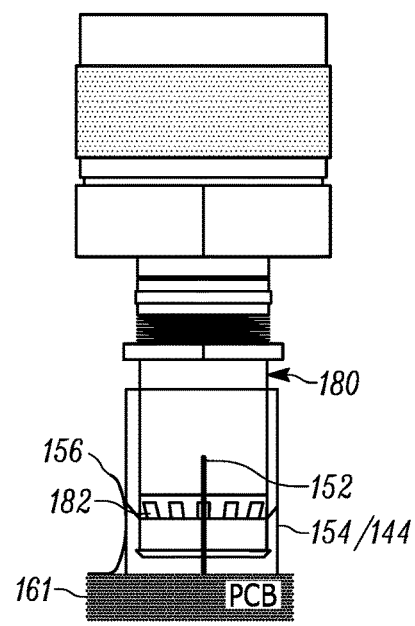
FIG. 6 is a schematic view depicting the test probe mated to the RF test point structure of FIG. 5.

FIG. 5 depicts a connector 180 prior to mating with the test point 144 of FIG. 3, and FIG. 6 depicts the connector 180 mated with the RF test point of FIG. 3. In operation, a user inserts the test probe 180 into the sleeve 154 of the test point 144 to monitor the forward path signal propagated through the main RF signal path 108.

Prior to inserting the test probe 180 (as shown in FIG. 5), the switch control logic 160 senses that the spring 156 is not coupled to ground because the test probe 180 has not been inserted into the test point 144 and the logic 160 has not received a ground signal via line 157. Accordingly, the switch control logic 160 maintains the switch 138 in the open position (as shown). In the open position (shown) of the switch 138, the forward path signal in line 108 is prevented from reaching the center conductor 152 of the test point 144, thereby averting a constant 1 dB loss (approximate) (as compared with the directional coupler 110 of the circuit 100). This is the normal state of the test point 144 and the circuit 200.

Upon inserting the test probe 180 into the sleeve 154 (as shown in FIG. 6), the spring clip 182 that is mounted to the exterior of the test probe 180 physically contacts and pushes outward the spring 156, thereby electrically connecting the spring 156 to ground. Additionally, upon insertion of the test probe 180, the center conductor 152 of the test point 144 physically connects to a female spring contact (not shown) embedded within the test probe 180. When the switch control logic 160 senses that the spring 156 is grounded (i.e., when it receives a ground signal from line 157), the switch control logic 160 closes the switch 138 (which is shown open in FIG. 3). In the closed position of the switch 138, the forward path signal in line 108 propagates through the closed switch 138 to the center conductor 152 of the test point 144 via line 153. The test probe 180 then receives the forward path signal in line 108 via the connection between the male center conductor 152 and the female spring contact in the test probe 180. The test probe 180 is connected to equipment (not shown) for monitoring the forward path signal in line 108.

Figure 7:
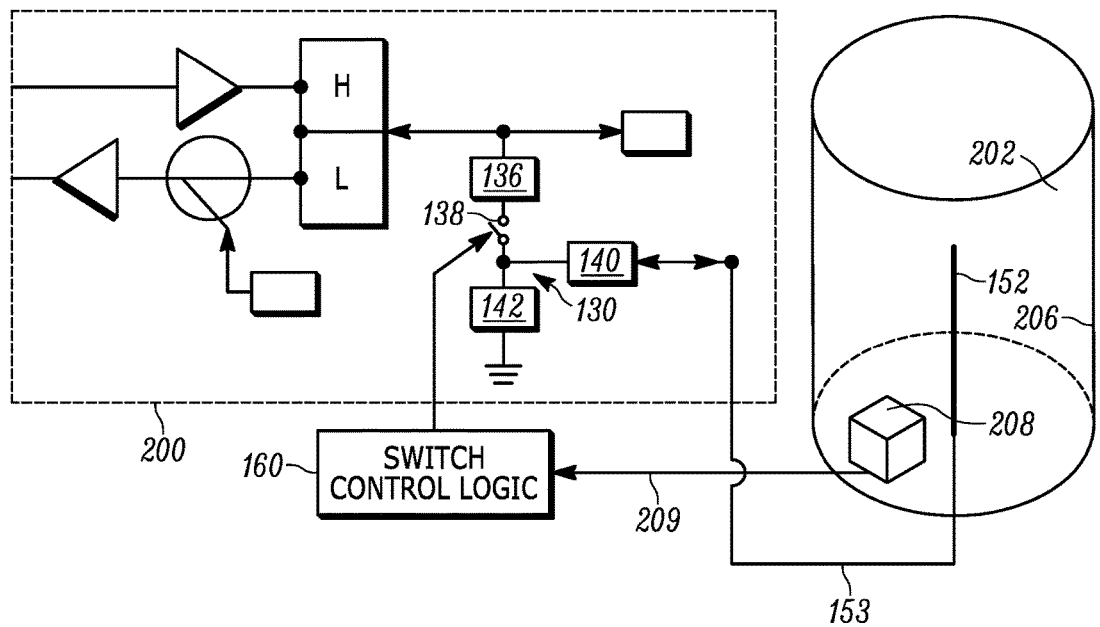
FIG. 7 is a schematic view depicting the circuit of FIG. 2 connected to an RF test point structure, according to another exemplary embodiment.
Figure 8:
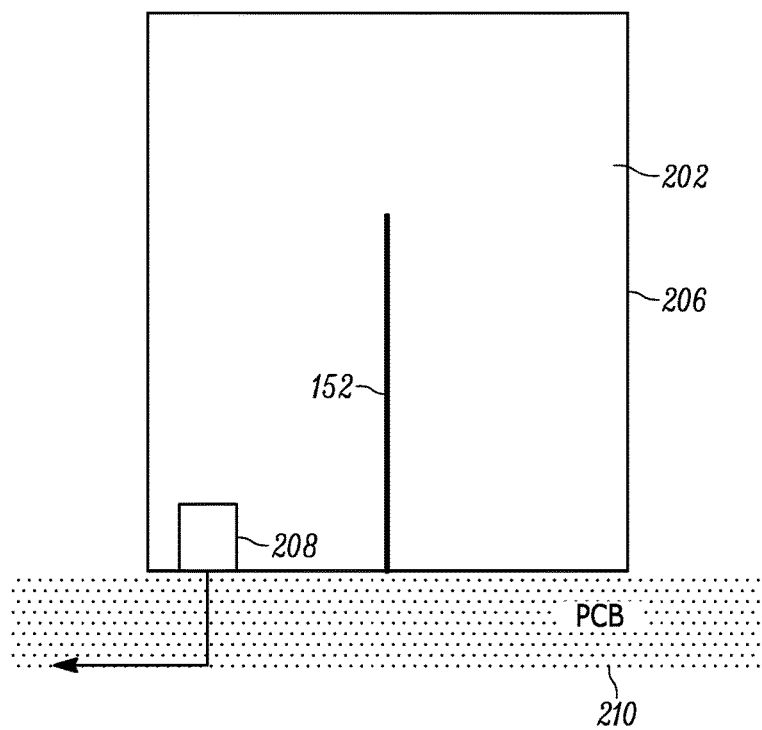
FIG. 8 is a schematic view depicting a cross-sectional view of the RF test point structure of FIG. 7.

FIG. 7 depicts the interconnection between a test point structure 202 and the test point circuit 130 of the circuit 200 of FIG. 2, according to another example. FIG. 8 depicts a cross-sectional view of the test point structure 202 of FIG. 7, which is shown schematically. The test point structure 202 is similar to the test point structure 144 of FIG. 4 and only the differences therebetween will be described.

The test point structure 202 is mounted to a circuit board 210. The test point structure 202 generally comprises the center conductor 152, an annular sleeve 206 having a continuous and solid wall surrounding the center conductor 152, and a grounding pad 208 that is positioned at the base of the cylindrical interior of the sleeve 206. The bottom end of the sleeve 206 may include an opening such that the grounding pad 208 can be both (i) directly connected to a conductive pad on the circuit board 210, and (ii) positioned within the cylindrical interior of the sleeve 206.

The center conductor 152 is electrically coupled to the second impedance block 140 of the circuit 130 by the line 153. The grounding pad 208 is electrically coupled to the switch control logic 160 by the line 209. The line 209 may be a ground trace. The grounding pad 208 may be directly mounted to a conductive pad on a surface of the circuit board 210 (the conductive pad being connected to the line 209). Alternatively, the grounding pad 208 may be indirectly mounted to the conductive pad by a lead or wire, for example.

A suitable grounding pad is sold by W.L Gore and Associates, Inc. of Newark Del., and described in U.S. Pat. Nos. 6,255,581 and 7,129,421, each of which is incorporated by reference herein in its entirety.

The circuit 200, or portions thereof, is bodily incorporated onto the printed circuit board 210, and the circuit 200 is electrically coupled to both the conductor 152 and the grounding pad 208, as is shown in FIG. 7. The center conductor 152 and the grounding pad 208 are mounted to separate traces on the board 210. The center conductor 152 and the grounding pad 208 are configured to interact with a standard RF test probe 180, as will be described hereinafter.

Figure 9:
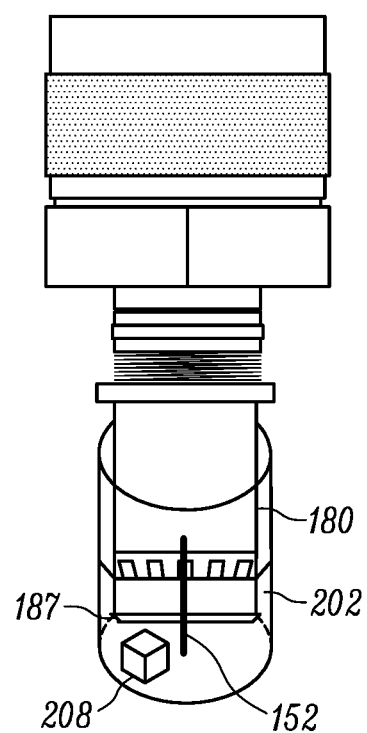
FIG. 9 is a schematic view depicting a test probe in the process of mating with the RF test point structure of FIG. 7.

Prior to inserting the test probe 180 (as shown in FIG. 9), the switch control logic 160 (FIG. 7) senses that the grounding pad 208 is not coupled to ground because the test probe 180 has not been inserted into the test point structure 202 and the switch control logic 160 has not received a ground signal via line 209. Accordingly, the switch control logic 160 maintains the switch 138 in the open position (as shown). In the open position (shown) of the switch 138, the forward path signal in line 108 is prevented from reaching the center conductor 152 of the test point structure 202, thereby averting a constant 1 dB loss (approximate) (as compared with the directional coupler 110 of the circuit 100). This is the normal state of the test point structure 202 and the circuit 200.

Figure 10:
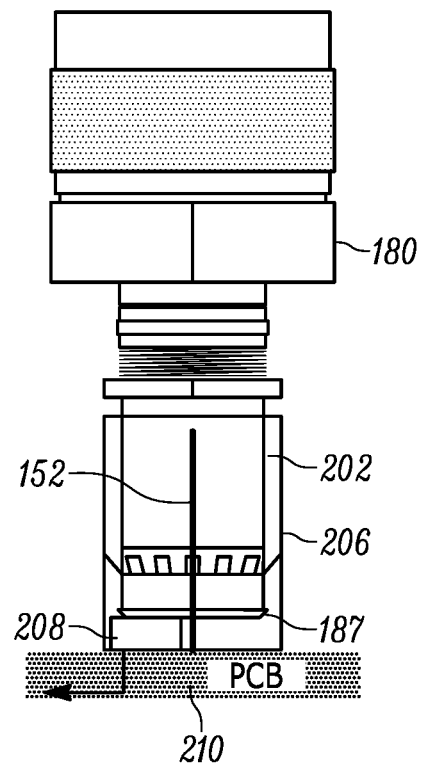
FIG. 10 is a schematic view depicting the test probe mated to the RF test point structure of FIG. 7.

Upon inserting the test probe 180 into the sleeve 206 (as shown in FIG. 10), the flat distal end 187 of the test probe 180 physically contacts and compresses the grounding pad 208, thereby connecting the grounding pad 208 to ground. Additionally, upon insertion of the test probe 180, the center conductor 152 of the test point structure 202 connects to a female spring contact (not shown) embedded within the test probe 180. When the switch control logic 160 senses that the grounding pad 208 is coupled to ground via line 209 (i.e., when logic 160 receives a ground signal via line 209), the switch control logic 160 closes the switch 138 (which is shown open in FIG. 7). In the closed position of the switch 138, the forward path signal in line 108 is directed through the closed switch 138 to the center conductor 152 of the test point structure 202 via line 153. The test probe 180 then receives the forward path signal in line 108 via the connection between the male center conductor 152 and the female spring contact in the test probe 180. The test probe 180 is connected to equipment (not shown) for monitoring the forward path signal in line 108.

The grounding pad 208 and the spring 156 may be considered, in a general sense, as a means for detecting the presence of the test probe mated to a test point structure. The grounding pad 208 and the spring 156 are only two examples of the means for detecting the presence of the test probe mated to a test point structure. Those skilled in the art will recognize that other examples exist, such as, for example, a mechanical sensor, an optical detector (photocell, laser, passive, charged coupled device, infrared), a magnetic detector, a fiber optic sensor, a proximity sensor, a capacitive sensor, an inductive sensor, a Hall effect sensor, and so forth.

Figure 11:
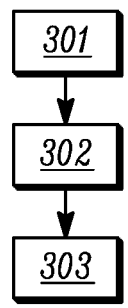
FIG. 11 depicts a block diagram showing a method of monitoring an RF signal carried through a main RF signal path using a test point structure that is connected to the main RF signal path.

FIG. 11 depicts a block diagram showing, at its most basic level, a method of monitoring an RF signal carried through a main RF signal path 108 using a test point 144 or 202 that is connected to the main RF signal path 108. The method comprises the first step 301 of detecting the presence of a test probe 180 mated to the test point structure 144 or 202; and the second step 302 of changing the state of a switch 138 in a test point circuit line 130, which electrically connects the main RF signal path 108 to a center conductor 152 of the test point structure 144 or 202, from an open state to a closed state, thereby directing the RF signal from the main RF signal path 108 through the test point circuit 130 and to the center conductor 152. The method may also include the step of returning the switch 138 back to the open state when step 301 has ended (i.e., when the presence of the test probe 180 mated to the test point structure 144 or 202 is no longer detected). The detecting step 302 may comprise detecting when a spring 156 mounted to the test point structure 144 is contacted by a surface of the grounding body of test probe 180. Alternatively, the detecting step 302 may comprise detecting when a grounding pad 208 mounted to the test point structure 202 is contacted by a surface of the grounding body of the test probe 180.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions.

The terms "comprises," "comprising," "includes," "including," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "a" or "an" does not, without further constraints, preclude the existence of additional identical or similar elements in the process, method, article, or apparatus that comprises the element.

The term "coupled" as used herein refers to any logical, physical or electrical connection, link or the like by which signals produced by one system element are imparted to another "coupled" element. Unless described otherwise, coupled elements or devices are not necessarily directly connected to one another and may be separated by intermediate components, elements or communication media that may modify, manipulate or carry the signals. Each of the various couplings may be considered a separate communications channel.

While the foregoing has described what are considered to be the best mode and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present concepts.

What is claimed is:

1. A test point circuit comprising:
   a main RF signal path,
   a test point structure having a center conductor and a grounded sleeve and being configured for connecting to a test probe for monitoring an RF signal carried through the main RF signal path,
   a test point RF signal circuit connecting the main RF signal path to the test point structure, the test point RF signal circuit comprising a switch,
   wherein, in an open position of the switch, the signal in the main RF signal path is prevented from propagating through the test point RF signal circuit and to the test point structure, and, in a closed position of the switch, the RF signal can propagate from the main RF signal path to the test point RF signal circuit and the test point structure such that the test probe connected to the test point structure can be used to measure the RF signal.

2. The test point circuit of claim 1 further comprising means for detecting the presence of the test probe when the test probe is mated to the test point structure.

3. The test point circuit of claim 2 further comprising a linkage connecting the detecting means and the switch, the switch being normally open, and wherein the linkage is configured to close the switch when the detecting means detects the presence of the test probe mated to the test point structure, such that when the switch is closed the RF signal propagates from the main RF signal path to the test point RF signal circuit and the test point structure so that the test probe connected to the test point structure can be used to measure the RF signal.

4. The test point circuit of claim 2, wherein the detecting means comprises a conductive resilient spring mounted to extend into an interior of the grounded sleeve of the test point either (i) through an opening of the grounded sleeve surrounding the center conductor, or (ii) from a printed circuit board (PCB) side, wherein the conductive resilient spring is positioned to be contacted by a grounded body of the test probe when the test probe is mated to the test point structure.

5. The test point circuit of claim 4, wherein the sleeve includes the opening through which the spring is at least partially positioned.

6. The test point circuit of claim 4, wherein the conductive resilient spring is electrically isolated from the grounded sleeve when the test probe is not mated to the test point structure, and the spring is electrically connected to the grounded sleeve via the grounded body of the test probe when the test probe is mated to the test point structure.

7. The test point circuit of claim 2, wherein the detecting means comprises a flexible grounding pad that is positioned within an interior of the grounded sleeve of the test point structure, the grounding pad being positioned to be contacted by a grounded body of the probe when the test probe is mated to the test point structure.

8. The test point circuit of claim 7, wherein the grounding pad is electrically isolated from the grounded sleeve when the test probe is not mated to the test point structure, and the grounding pad is electrically connected to the grounded sleeve via the grounded body of the test probe when the test probe is mated to the test point structure.

9. The test point circuit of claim 1, wherein the test point circuit forms part of broadband and hybrid fiber coax (HFC) equipment.

10. A test point circuit comprising:
    a main RF signal path,
    a test point structure having a center conductor and a grounded sleeve, the test point structure being configured for connecting to a test probe for monitoring an RF signal carried through the main RF signal path,
    a test point RF signal circuit connecting the main RF signal path to the test point structure, the test point RF signal circuit comprising a switch,
    wherein, in an open position of the switch, the RF signal in the main RF signal path is prevented from propagating through the test point RF signal circuit and to the test point structure, and, in a closed position of the switch, the RF signal can propagate from the main RF signal path to the test point RF signal circuit and the test point structure such that the test probe connected to the test point structure can be used to measure the RF signal,
    a means for detecting the presence of the test probe when the test probe is mated to the test point structure, and
    a linkage connected between the detecting means and the switch, wherein the linkage is configured to close the switch when the detecting means detects the presence of the test probe when the test probe is mated to the test point structure.

11. The test point circuit of claim 10, wherein the detecting means comprises a resilient spring mounted at least partially within the grounded sleeve of the test point surrounding the center conductor, and wherein the spring is positioned to be contacted by the test probe when the test probe is mated to the test point structure.

12. The test point circuit of claim 11, wherein the grounded sleeve includes an opening in which the spring is at least partially positioned.

13. The test point circuit of claim 11, wherein the spring is electrically isolated from the center conductor.

14. The test point circuit of claim 10, wherein the detecting means comprises a grounding pad that is positioned within the grounded sleeve of the test point surrounding the center conductor, the grounding pad being positioned to be contacted by the test probe when the test probe is mated to the test point structure.

15. The test point circuit of claim 10, wherein the detecting means is coupled to ground when the test probe is mated to the test point structure.

16. The test point circuit of claim 10, wherein the detecting means is not coupled to ground when the test probe is not mated to the test point structure.

17. The test point circuit of claim 10, wherein the test point circuit forms part of broadband and hybrid fiber coax (HFC) equipment.

18. A method of monitoring an RF signal carried through a main RF signal path using a test point circuit that is connected to the main RF signal path, said method comprising:
    detecting the presence of a test probe mated to a test point structure; and
    changing the state of a switch in the test point circuit, which electrically connects the main RF signal path to a center conductor of the test point structure, from an open state to a closed state, thereby directing the RF signal from the main RF signal path through the test point circuit and to the center conductor of the test point structure.

19. The method of claim 18 further comprising the step of returning the switch back to the open state when the presence of the test probe is no longer detected.

20. The method of claim 18, wherein the detecting step comprises detecting when a flexible conductive spring mounted to the test point structure is contacted by a surface of a grounded body of the test probe.

21. The method of claim 18, wherein the detecting step comprises detecting when a flexible grounding pad mounted to the test point structure is contacted by a surface of a grounded body of the test probe.

* * * * *